United States Patent
Muraki et al.

(10) Patent No.: US 9,171,698 B2
(45) Date of Patent: Oct. 27, 2015

(54) DRAWING APPARATUS, AND METHOD OF MANUFACTURING ARTICLE

(71) Applicant: CANON KABUSHIKI KAISHA, Tokyo (JP)

(72) Inventors: Masato Muraki, Inagi (JP); Tomoyuki Morita, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/312,908

(22) Filed: Jun. 24, 2014

(65) Prior Publication Data

US 2015/0004807 A1 Jan. 1, 2015

(30) Foreign Application Priority Data

Jun. 26, 2013 (JP) ................. 2013-134211
Mar. 12, 2014 (JP) ................. 2014-049317

(51) Int. Cl.
*H01J 37/317* (2006.01)
*H01J 37/244* (2006.01)
*H01J 37/30* (2006.01)
*H01J 37/04* (2006.01)

(52) U.S. Cl.
CPC .......... *H01J 37/3177* (2013.01); *H01J 37/045* (2013.01); *H01J 37/244* (2013.01); *H01J 37/3007* (2013.01)

(58) Field of Classification Search
USPC ...................................... 250/492.23
See application file for complete search history.

(56) References Cited

U.S. PATENT DOCUMENTS 7,276,714 B2  10/2007  Platzgummer et al.
2014/0322653 A1*  10/2014  Muraki et al. ................ 430/296
2015/0001417 A1*  1/2015  Morita et al. ............. 250/396 R

FOREIGN PATENT DOCUMENTS

JP         4858745 B2    1/2012

* cited by examiner

*Primary Examiner* — Kiet T Nguyen
(74) *Attorney, Agent, or Firm* — Rossi, Kimms & McDowell LLP (57) ABSTRACT

A drawing apparatus for performing drawing on a substrate with a charged particle beam, includes: a controller configured to control a dose of the charge particle beam at each of a plurality of positions of the charged particle beam on the substrate based on information of displacement of each of the plurality of positions from a target position corresponding thereto and a target dose of the charged particle beam at the target position corresponding to each of the plurality of positions.

13 Claims, 9 Drawing Sheets

FIG. 9

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

As a drawing apparatus used to manufacture a device such as a semiconductor integrated circuit, Japanese Patent No. 4858745 proposes an apparatus that performs pattern drawing on a substrate using a plurality of electron beams arrayed regularly to increase the productivity. The drawing apparatus described in Japanese Patent No. 4858745 modulates the dose of each of the regularly arrayed electron beams to draw a pattern in an arbitrary shape at an arbitrary position by the electron beam.

Figure 1A:
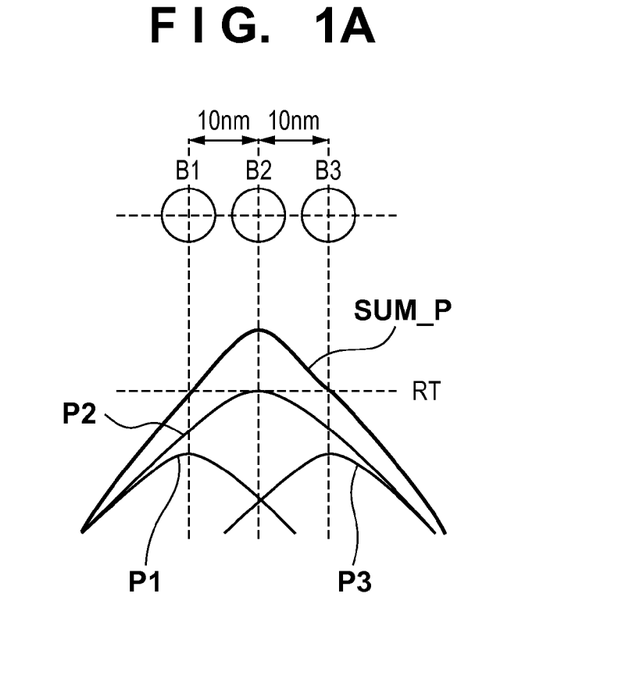
FIGS. 1A and 1B are views for explaining patterns when there is an array error of electron beams.

The drawing apparatus described in Japanese Patent No. 4858745 arrays the plurality of electron beams on the substrate, and adjusts the tones of drawing pixels formed at an equal pitch by modulating these electron beams, thereby drawing an arbitrary pattern on the substrate. A state of the drawing will be described with reference to FIGS. 1A and 1B. Electron beams B1, B2, and B3 are designed to be arrayed at a pitch of 10 nm. Intensity profiles of the electron beams B1 to B3 in the drawing pixels corresponding to the electron beams B1 to B3 are referred to as P1, P2, and P3, respectively. A combined intensity profile (dose distribution) obtained by summing P1 to P3 is referred to as SUM_P. As shown in FIG. 1A, if the electron beams B1 to B3 are arrayed as designed, a resist pattern whose width, that is, line width of a region in which SUM_P is equal to or larger than a development threshold RT of a resist is 20 nm is formed at a predetermined position by setting the intensities of P1 and P3 to 50% of that of P2. In addition, if the intensities of P1 and P3 are set to 100% of that of P2, a resist pattern having the line width of 30 nm is designed to be formed.

Figure 1B:
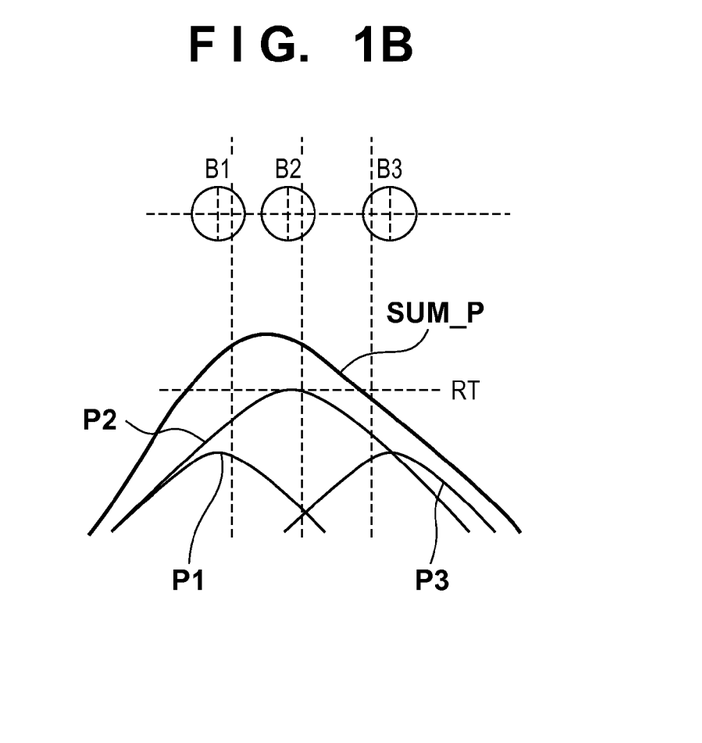

In reality, however, the electron beams B1 to B3 are not arrayed at a pitch of 10 nm as designed, but arrayed with errors as shown in FIG. 1B. Therefore, the target combined intensity profile (dose distribution) SUM_P cannot be obtained, and a resist pattern with different line width and formation position is formed. It is impossible to faithfully form a resist pattern corresponding to a design pattern.

SUMMARY OF THE INVENTION

The present invention provides, for example, a drawing apparatus advantageous in terms of realizing of a target dose distribution.

The present invention in one aspect provides a drawing apparatus for performing drawing on a substrate with a charged particle beam, the apparatus comprising: a controller configured to control a dose of the charge particle beam at each of a plurality of positions of the charged particle beam on the substrate based on information of displacement of each of the plurality of positions from a target position corresponding thereto and a target dose of the charged particle beam at the target position corresponding to each of the plurality of positions.

Further features of the present invention will become apparent from the following description of exemplary embodiments with reference to the attached drawings.

DESCRIPTION OF THE EMBODIMENTS

The embodiment of the present invention will be described below with reference to the accompanying drawings. Note that the same reference numerals denote the same members and the like in principle throughout the drawings for explaining the embodiment, and a repetitive description thereof will be omitted.

[Drawing Apparatus]

Figure 2:
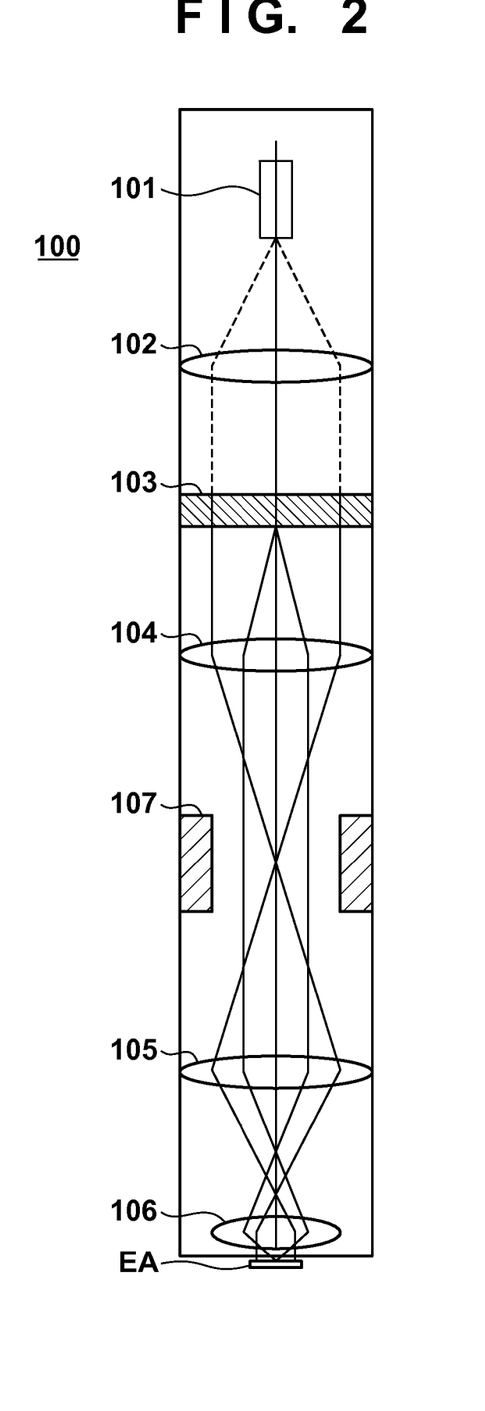
FIG. 2 is a view showing the arrangement of an electron optical system.

FIG. 2 is a view showing the arrangement of an electron optical system (charged particle optical system) 100 which is used in a drawing apparatus according to the present invention. In this embodiment, a drawing apparatus which performs drawing on a substrate using an electron beam will be described. However, the present invention is also usable for a drawing apparatus which performs drawing on the substrate using another charged particle beam such as an ion beam. A so-called thermoelectron (thermal electron) emission electron source including, for example, $LaB_6$ or BaO/W (dispenser cathode) as an electron emitting material can be used as an electron source 101. An electrostatic lens configured to converge an electron beam by an electric field can be used as a collimator lens 102. An electron beam emitted by the electron source 101 changes to an almost parallel electron beam via the collimator lens 102.

A blanking aperture array 103 divides the electron beam from the collimator lens 102 into a plurality of electron beams by two-dimensionally arrayed apertures, and controls passage of each electron beam through a drawing region EA by an electrostatic blanker (not shown) which can be driven for each divided electron beam. The blanking aperture array 103 and the electrostatic blanker (not shown) constitute a blanking unit configured to determine irradiation or non-irradiation of the electron beam on the substrate. An electrostatic electron lens 104 and a magnetic field electron lens 105 form an intermediate image of the plurality of apertures of the blanking aperture array 103 by their lens effects. A magnetic field electron lens 106 acts as an objective lens and projects the intermediate image of the apertures onto the drawing region EA. The electrostatic electron lens 104, the magnetic field electron lens 105, and the magnetic field electron lens 106 constitute a projection system configured to project the plurality of electron beams that have passed through the blanking aperture array 103 on a wafer 10. A deflector 107 deflects the plurality of electron beams that have passed through the blanking aperture array 103 in a predetermined direction at once.

Figure 3:
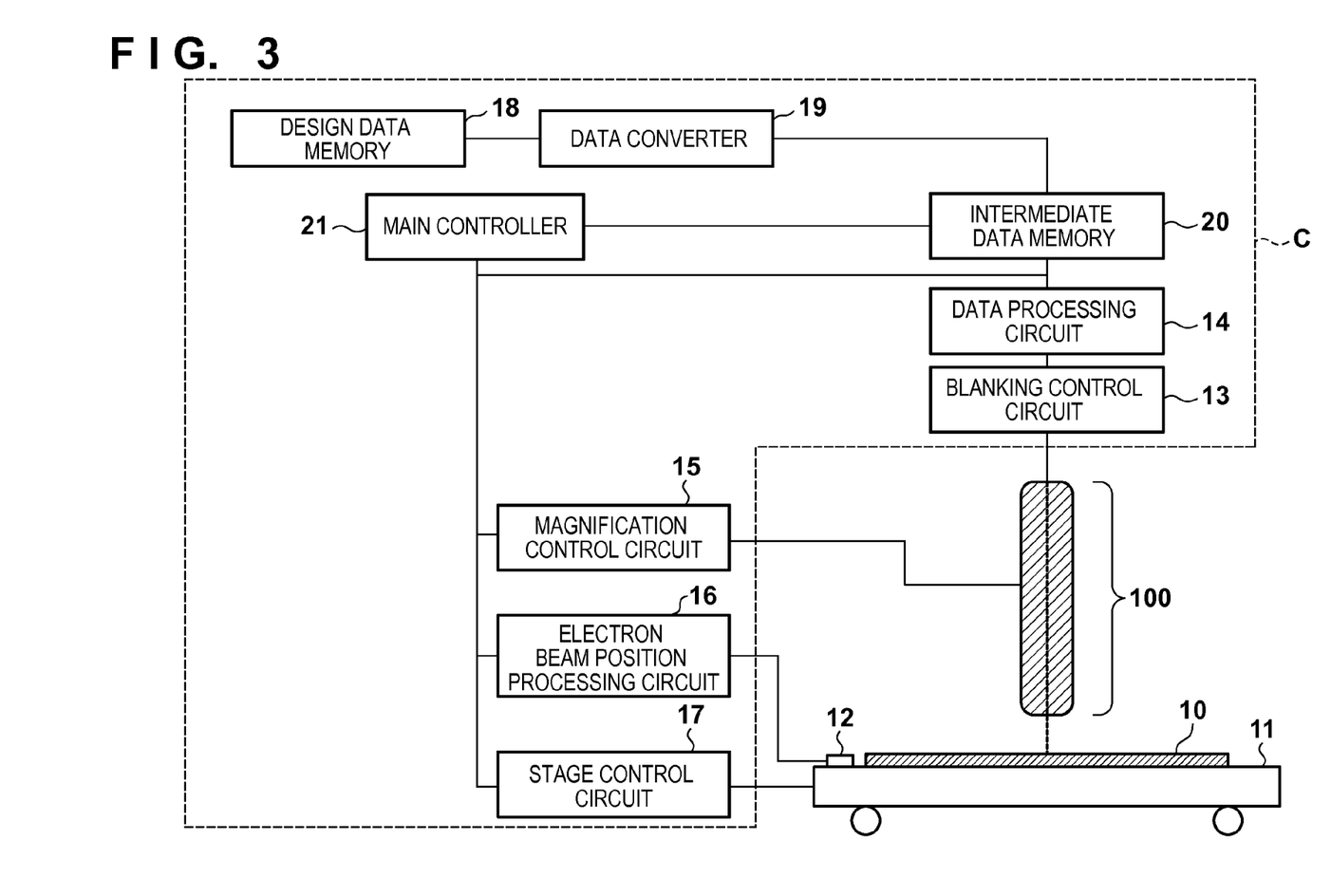
FIG. 3 is a block diagram showing a drawing apparatus.

FIG. 3 shows an example of the drawing apparatus according to the present invention. The drawing apparatus includes, in addition to the aforementioned electron optical system 100, an X-Y stage (stage) 11 movable within an X-Y plane (horizontal plane) perpendicular to an optical axis with holding the wafer (substrate) 10. The stage 11 includes an electrostatic chuck configured to hold the substrate 10. A detector 12 configured to detect the position on the substrate and the current of the electron beam irradiating the wafer 10 is arranged on the stage 11.

The blanking control circuit 13 individually controls each blanking aperture array 103. A data processing circuit 14 includes a buffer memory and generates control data of the blanking control circuit 13. A magnification control circuit 15 controls the magnification of the magnetic field electron lens 105. An electron beam position processing circuit 16 calculates an actual position and current value of each electron beam based on a signal from the detector 12. A stage control circuit 17 controls the position of the stage 11 in cooperation with laser interferometers (not shown) configured to measure the position of the stage 11.

A design data memory 18 stores design graphic data of a shot pattern to be drawn. A data converter 19 divides the design graphic data into stripe units having a width set by the drawing apparatus, thereby converting the data into intermediate graphic data to facilitate subsequent processing. An intermediate data memory 20 stores the intermediate graphic data converted by the data converter 19. The intermediate data memory 20 stores compressed stripe data. In accordance with a pattern to be drawn, a main controller 21 transfers the intermediate graphic data to the buffer memory of the data processing circuit 14 and controls the above-described plurality of control circuits and processing circuits, thereby generally controlling the drawing apparatus. The main controller 21 and the above-described plurality of control circuits, processing circuits and the like constitute a controller of the drawing apparatus.

Figure 4A:
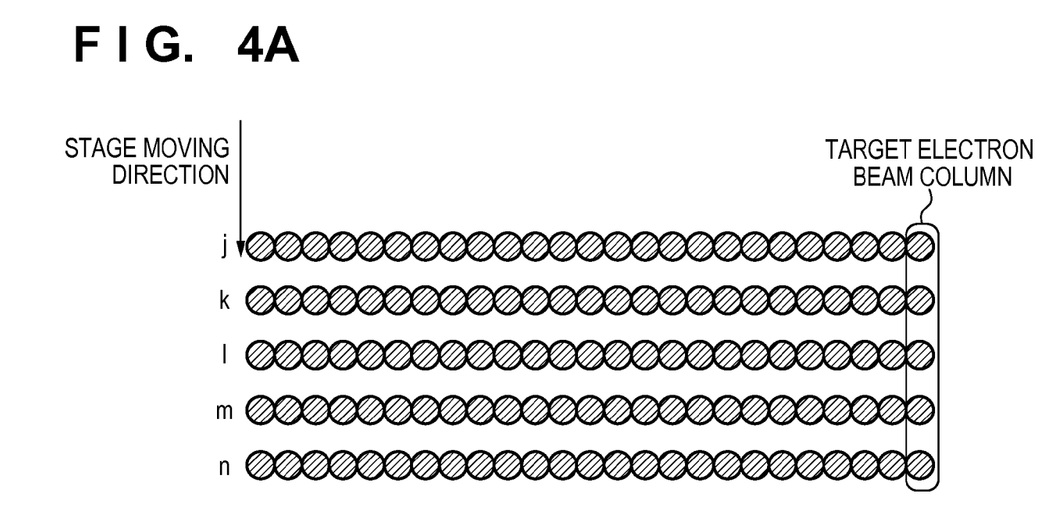
FIGS. 4A to 4C are views for explaining multiple drawing.
Figure 4B:
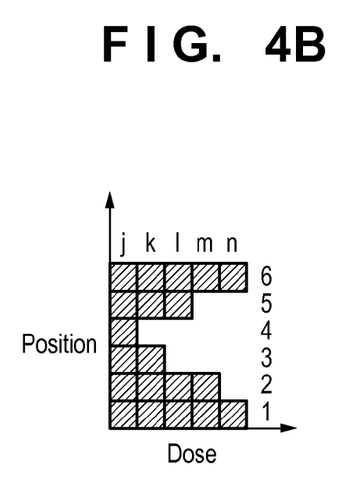
Figure 4C:
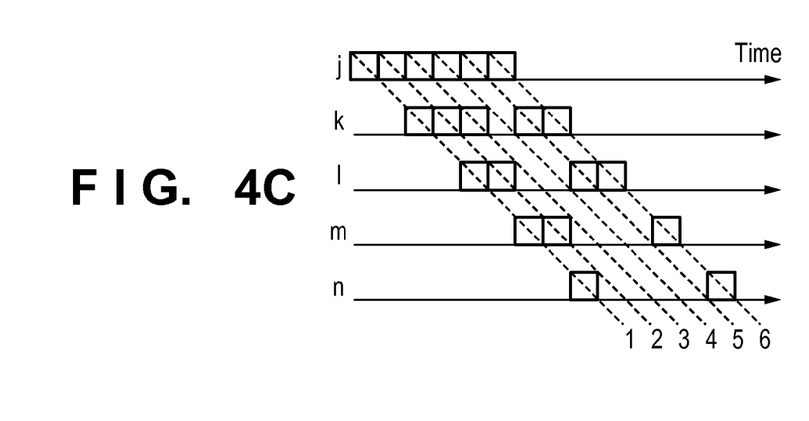

FIGS. 4A to 4C are views for explaining a basic drawing method of the drawing apparatus according to this embodiment. FIG. 4A illustrates the array of electron beams on a drawing region EA of the electron optical systems 100. In this embodiment, the electron beam array includes 5 (rows)×20 (columns) electron beams. The row pitch is twice larger than the column pitch. As shown by an arrow in FIG. 4A, the stage 11 moves from the upper side to the lower side of the drawing. A method of drawing by the target electron beam array shown in FIG. 4A using an irradiation pattern of a designated dose at positions 1 to 6 in the same column on the wafer 10 as shown in FIG. 4B will be explained here. All electron beams irradiate the wafer 10 by the same clock. Assume that the rows of the target electron beam array are represented by j, k, l, m, and n and the stage 11 continuously moves at a speed to move by one column pitch on a unit clock basis.

At this time, when a time table of on/off signals on a unit clock basis of the rows (j to n) of the target electron beam array are set as shown in FIG. 4C, an irradiation pattern as shown in FIG. 4B is obtained. Referring to FIG. 4C, lines 1 to 6 are the on/off signals of the rows (j to n) irradiated at the same positions 1 to 6 on the wafer 10. Since the stage 11 moves by one row pitch by two unit clocks, the lines at identical positions shift by the two unit clocks per one row. That is, the irradiation pattern as shown in FIG. 4B is obtained by adding the electron beams of the rows j to n shifted by the two unit clocks.

The number of rows in which the electron beams are turned on, that is, the number of electron beams which overlappingly irradiate the substrate at the same position determines the tone of the irradiation pattern. Therefore, the irradiation pattern is obtained only after the electron beams of all rows j to n end the drawing. Furthermore, the total width of the plurality of columns of the electron beams shown in FIG. 4A corresponds to a stripe width set by the drawing apparatus. In actuality, on the wafer, a column pitch is several ten nm and the number of columns is 4,000, so the stripe width is 80 to 100 μm.

Figures 5A, 5B:
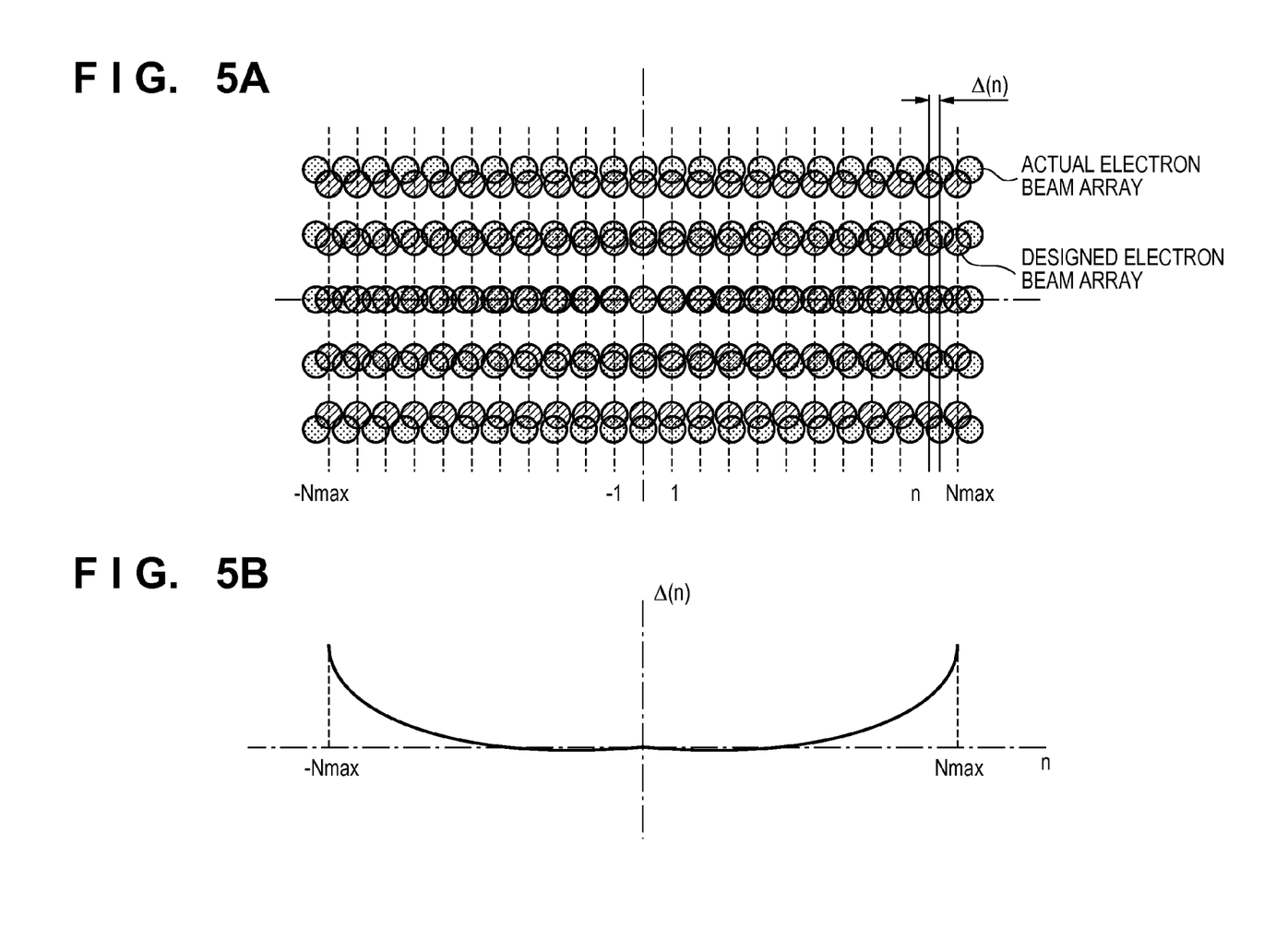
FIGS. 5A and 5B are views for explaining a designed electron beam array and an actual electron beam array.

A method of correcting an array error of the electron beams in the drawing apparatus according to this embodiment will be described. FIG. 5A displays a designed electron beam array on the substrate 10 and an actual electron beam array. The actual electron beam array is based on an actual position of each electron beam on the substrate 10 which is calculated by the electron beam position processing circuit 16 based on an output from the detector 12. The position of each electron beam in the column direction is normalized at a pitch of the electron beams.

Accordingly, the coordinate of the position (target position) in the column direction of each electron beam in the designed electron beam array is represented by an integer. $\Delta(n)$ represents a displacement of the position corresponding to the target position having a coordinate n from the target position. FIG. 5B displays the displacement $\Delta(n)$ relationship between the coordinate n at the target position and the corresponding actual position. The drawing apparatus assumes that a displacement amount of the position in the same column is the same since the electron beams have the number of columns (actually 248) smaller than the number of rows (actually 4,000 or more).

A value $F(n)$ of the coordinate of the actual position corresponding to the coordinate n at the target position is represented by:

$$F(n) = n + \Delta(n) \quad (1)$$

The stripe width is fixed by the apparatus. Therefore, the projection magnification of the electron optical system 100 needs to be adjusted so as to set the electron beams positioned at both ends in the column direction to be coordinate values (n=Nmax, −Nmax) at the target position. An adjustment magnification $\beta$ of the electron optical system 100 is represented by:

$$\beta = 2 \times N\text{max}/\{|(-N\text{max}+\Delta(-N\text{max})|+(N\text{max}+\Delta(N\text{max}))\} \quad (2)$$

The magnification control circuit 15 adjusts the magnification of the magnetic field electron lens 105 based on this adjustment magnification $\beta$. A coordinate value $G(n)$ of the actual position of the electron beam after magnification adjustment which corresponds to the target position of the coordinate n is represented by:

$$G(n) = \beta \times F(n) \quad (3)$$

The positions of the electron beams positioned at the both ends in the column direction are adjusted to be the target positions by performing magnification adjustment. If there is the array error, however, even though magnification adjustment is performed, the actual position $G(n)$ after magnification adjustment is not normally set as an integer, whereas the coordinate at the target position is an integer n. Therefore, in order to obtain the target combined intensity profile (SUM_P: target dose distribution) in the electron beam array after magnification adjustment, the intensity at the actual position of the electron beam should be interpolated from the intensity at the target position of the electron beam.

Now, assume that integers which sandwich $G(n)$ are k and (k+1). In addition, when the intensity at the position n is l(n), the intensity at the position $G(n)$ is represented by l($G(n)$). Likewise, the intensities at the positions of two integers k and (k+1) which sandwich the position $G(n)$ are represented by l(k) and l(k+1), respectively. The intensity l($G(n)$) at the position $G(n)$ can be calculated by a linear interpolation as in equation (4) below using the two intensities l(k) and l(+1) at the positions of the two integers k and (k+1):

$$l(G(n)) = u \times l(k) + V \times l(k+1) \quad (4)$$

for u=(k+1)−G(n) and v=G(n)−k.

Figure 7A:
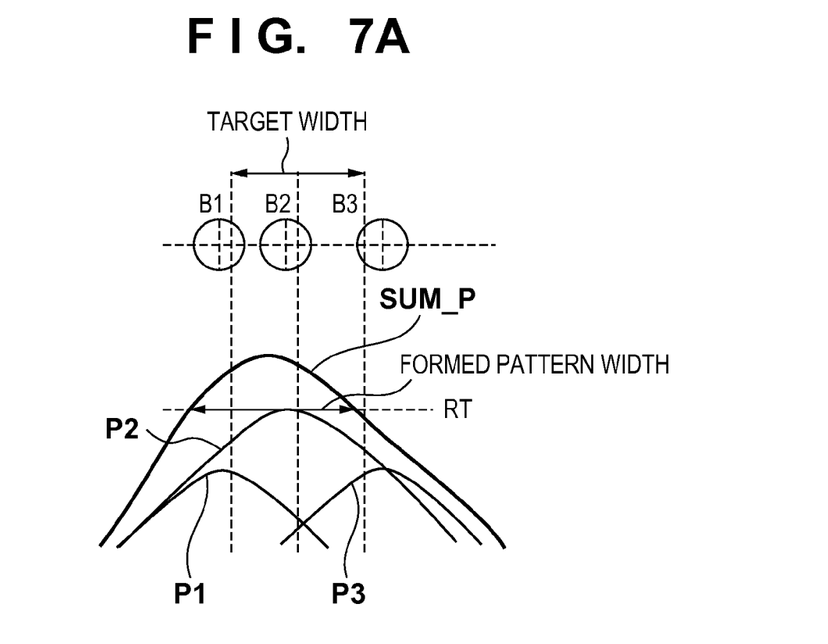
FIGS. 7A and 7B are views for explaining a correction result of the array errors of the electron beams.
Figure 7B:
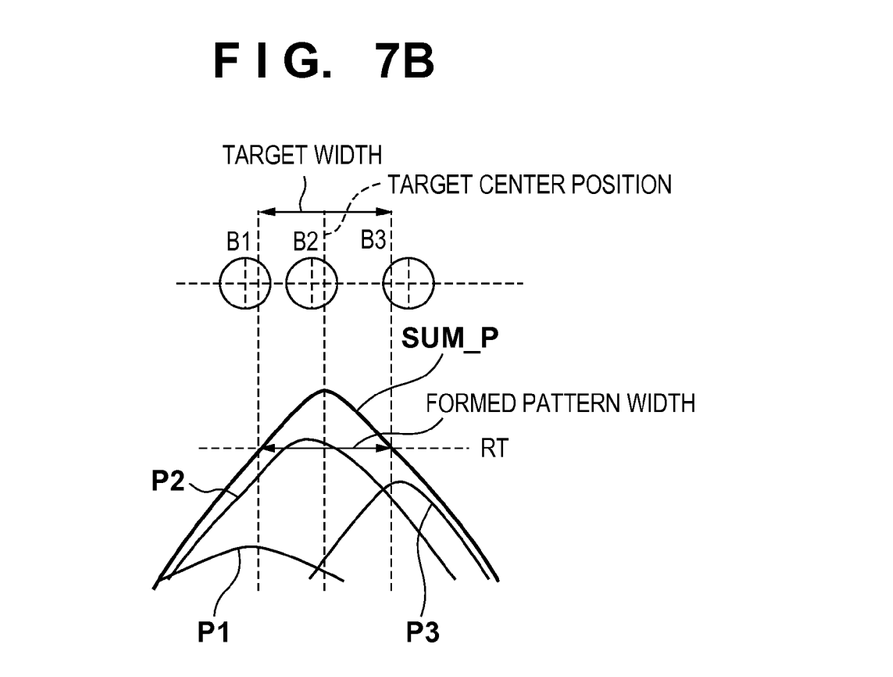

In this embodiment, the array error of the electron beams is corrected by obtaining the intensity at the actual position G(n) after magnification adjustment using the intensities at the plurality of target positions thus represented by the integers k and (k+1). FIGS. 7A and 7B show the combined intensity profiles (SUM_P) when the aforementioned correction has not been performed after magnification adjustment (FIG. 7A) and when the correction has been performed (FIG. 7B), respectively. In the case of FIG. 7A in which the correction has not been performed, both the center position and the width of the pattern to be actually formed are shifted greatly from a target values.

On the other hand, in the case of FIG. 7B in which the array error has been corrected after magnification adjustment, the difference between the combined intensity profile (SUM_P) and the target falls within an allowable range even if the electron beam array has an error. As a result, in the case of FIG. 7B in which the array error has been corrected based on positional displacement information, a pattern having the width and position corresponding to a design pattern is formed accurately. As shown in FIG. 7B, the array of each of the electron beams B1 to B3 is still shifted from the target position represented by a dotted line even after magnification adjustment. In FIG. 7B, by correcting the array error, the intensity of B2 is increased to be slightly higher than 100% as designed, the intensity of B3 is increased (about 70%) to be much higher than 50% as designed, and the intensity of B1 is decreased (about 30%) to be much lower than 50% as designed. Consequently, as seen in FIG. 7B, a region having a value equal to or larger than the threshold RT of the combined intensity profile SUM_P(a) of the three electron beams B1 to B3 is corrected to the right direction, and its width gets closer to a designed width.

Next, another example of a method of correcting (compensating) the array error of the electron beams will be described below. First, the right-hand side of equation (3) is further represented by the most right-hand side:

$$G(n) = \beta \times F(n) = n + \Delta g(n) \quad (3')$$

Figure 6:
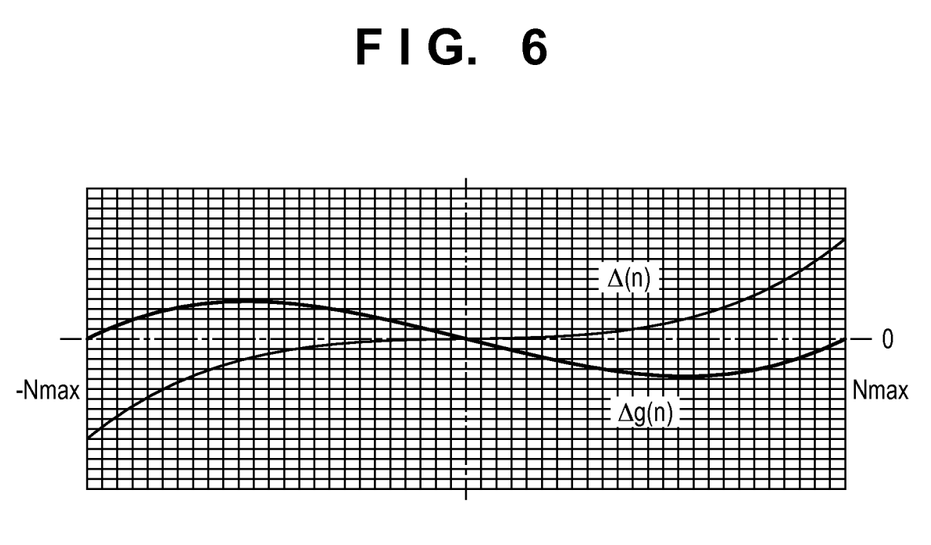
FIG. 6 is a graph for explaining the designed electron beam array and the actual electron beam array.

As for G(n), FIG. 6 shows the displacement Δg(n) relationship between the coordinate n at the target position and the corresponding actual position. The relationship between the coordinates n and Δ(n) is shown again in FIG. 6. Unlike in FIG. 5B, when n is negative, Δ(n) takes a negative value in consideration of a displacement direction. As can be seen in FIG. 6, the positions of the electron beams positioned at the both ends in the row direction are adjusted to be the target positions by magnification adjustment. If there is the array error, however, even though magnification adjustment is performed, the actual position G(n) after magnification adjustment is not normally set as an integer, whereas the coordinate at the target position is set as an integer.

Figure 8:
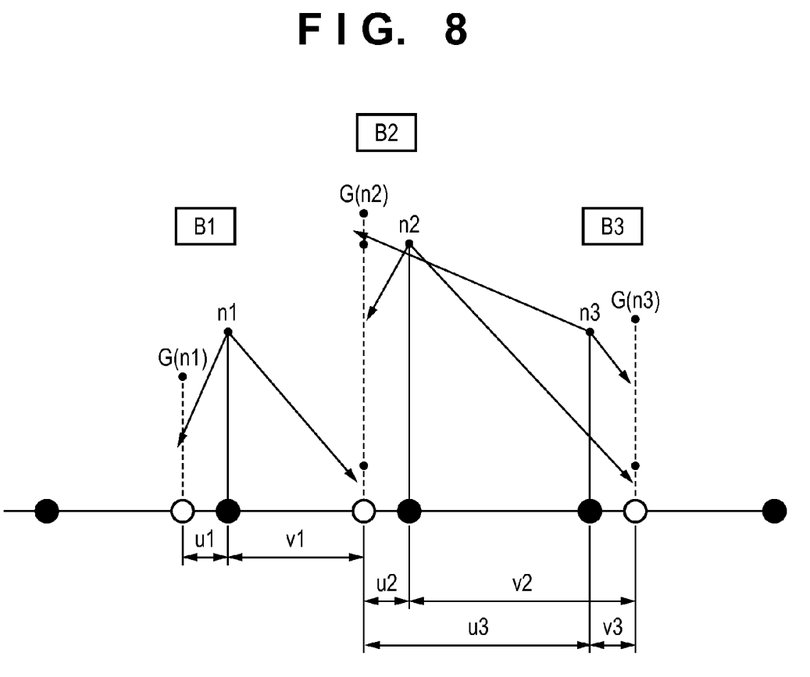
FIG. 8 is a view for explaining another example of an interpolation method.

FIG. 8 shows another example of a method of interpolating the intensity at the actual position of the electron beams from the intensity at the target position of the electron beams to obtain the target combined intensity profile (SUM_P: target dose distribution) in the electron beam array after magnification adjustment. Full circles n1, n2, and n3 are the coordinates at the target positions of the electron beams B1, B2, and B3, respectively. Open circles G(n1), G(n2), and G(n3) are the coordinates of the actual positions of the electron beams B1, B2, and B3, respectively. In the interpolation method of FIG. 8, the intensity lG(n) at the actual position G(n) corresponding to the target position n is determined as equations (4'), (5'), and (6') below in a form of dividing the intensity l(n) of the adjacent target position:

$$lG(n1) = l(n1) \times \{v1/(u1+v1)\} \quad (4')$$

$$lG(n2) = l(n1) \times \{u1/(u1+v1)\} + l(n2) \times \{v2/(u2+v2)\} + l(n3) \times \{v3/(u3+v3)\} \quad (5')$$

$$lG(n3) = l(n2) \times \{u2/(u2+v2)\} + l(n3) \times \{u3/(u3+v3)\} \quad (6')$$

When correction has not been performed using equations (4') to (6') after magnification adjustment, both the center position and width of the pattern to be actually formed are shifted greatly from the target values, as in FIG. 5A. On the other hand, when the array error has been corrected after magnification adjustment, the difference between the combined intensity profile (SUM_P) and the target falls within the allowable range even if the electron beam array has the error, as in FIG. 5B. As a result, when the array error has been corrected (compensated) based on the positional displacement information, the pattern of the width and the position corresponding to the design pattern is formed accurately.

Figure 9:
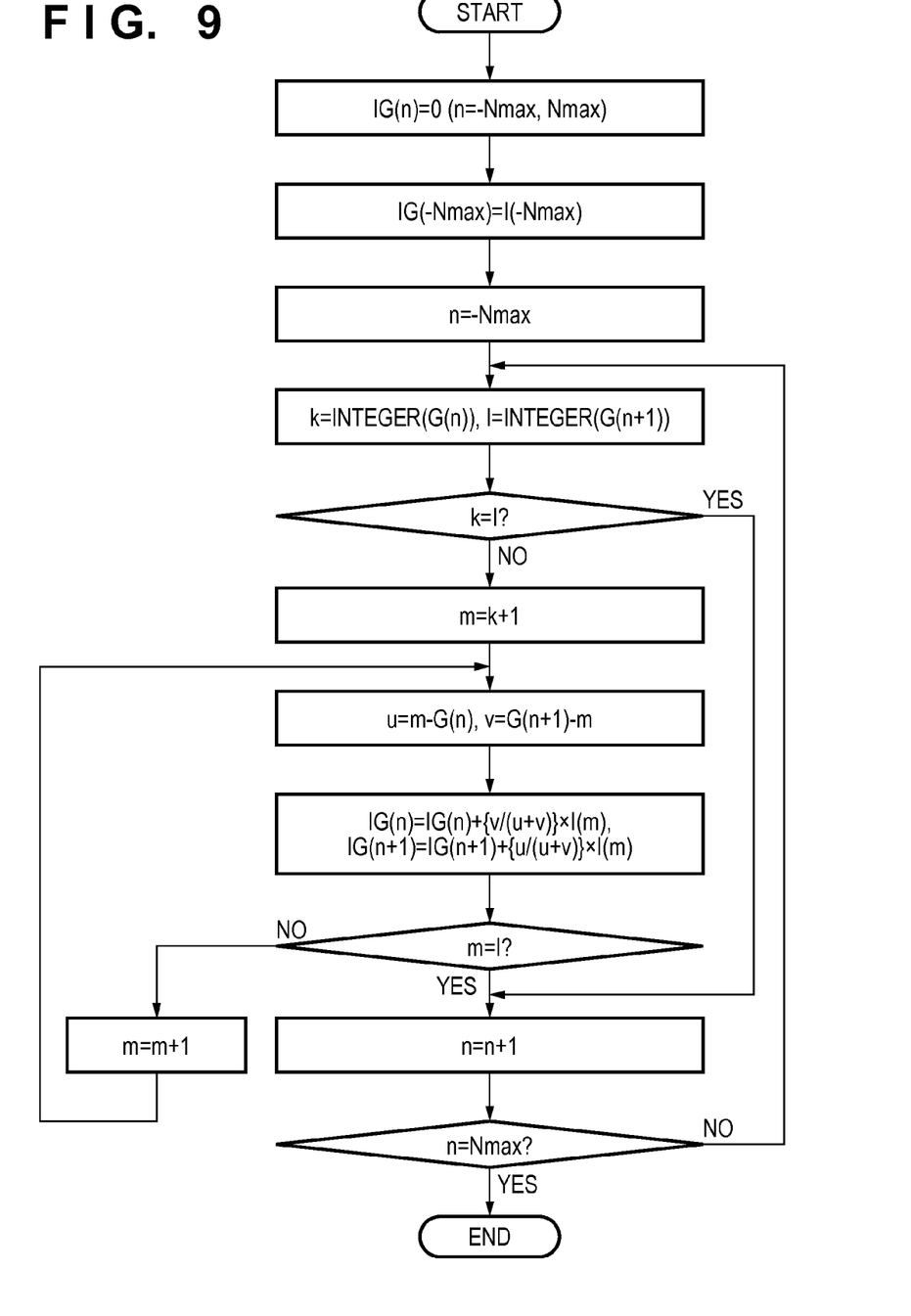
FIG. 9 is a detailed flowchart showing the other example of the interpolation method.

FIG. 9 shows a detailed process flow of the aforementioned interpolation process. In FIG. 9, n is an integer and represents the target position and beam address of the electron beam. G(n) represents the actual position of the electron beam. l(n) represents a data string of the intensity corresponding to the target position n. lG(n) represents a data string of the intensity interpolated at the position G(n). INTEGER (G) represents a function which returns the largest integer smaller than G(n). The data processing circuit 14 converts the data string l(n) of the intensity at the target position into the data string lG(n) of the interpolated intensity by executing the process in FIG. 9. The data string is transferred to the blanking control circuit 13 as control data.

In this embodiment, the number of electron beams which overlappingly irradiating the substrate at the same position is adjusted to adjust the dose of the electron beam at each position on the substrate. However, the dose of the electron beam may be adjusted by adjusting the time of the electron beam determined by the blanking unit. In this embodiment, the magnification of the magnetic field electron lens 105 is adjusted before correcting the array error of the electron beams. However, for example, when drawing is performed so that a pattern overlaps with an underlayer having the magnification error, the array error of the electron beams can be corrected (compensated) by adjusting the magnification of the magnetic field electron lens 105 in consideration of the magnification error or without adjusting the magnification of the magnetic field electron lens 105.

[Method of Manufacturing Article]

The aforementioned drawing apparatus can be used, for example, to manufacture an article, for example, a micro device such as a semiconductor device or an element having a fine structure. The method of manufacturing the article can include a step of forming a latent image pattern on a photoresist of a substrate with the photoresist applied on it using the drawing apparatus (a step of performing drawing on a substrate), and a step of developing the substrate on which the latent image pattern is formed in the above step. The manufacturing method can also include other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-134211, filed Jun. 26, 2013, and Japanese Patent Application No. 2014-049317, filed Mar. 12, 2014 which are hereby incorporated by reference herein in their entirety.

What is claimed is:

1. A drawing apparatus for performing drawing on a substrate with a charged particle beam, the apparatus comprising:
a controller configured to control a dose of the charge particle beam at each of a plurality of positions of the charged particle beam on the substrate based on information of displacement of each of the plurality of positions from a target position corresponding thereto and a target dose of the charged particle beam at the target position corresponding to each of the plurality of positions.

2. The apparatus according to claim 1, further comprising a detector configured to detect the charged particle beam,
wherein the controller is configured to obtain the information based on an output from the detector.

3. The apparatus according to claim 1, further comprising a blanking device configured to perform blanking of the charged particle beam,
wherein the controller is configured to control the dose by controlling the blanking device.

4. The apparatus according to claim 1, wherein the controller is configured to control the dose by controlling number of charged particle beams with which each of the plurality of positions are irradiated.

5. The apparatus according to claim 1, wherein
the drawing apparatus performs the drawing with a plurality of charged particle beams,
the drawing apparatus comprises a projection system configured to project the plurality of charged particle beams on the substrate, and
the controller is configured to determine a projection magnification of the projection system, and obtain, as the information, information of displacement of a position of each of the plurality of charge particle beams projected on the substrate with the projection magnification from a target position corresponding thereto.

6. A drawing apparatus for performing drawing on a substrate with a plurality of charged particle beams, the apparatus comprising:
a controller configured to control a dose at a position of each of the plurality of charged particle beams on the substrate based on a target position of each of the plurality of charged particle beams on the substrate, a target dose at the target position of each of the plurality of charged particle beams, and a position of each of the plurality of charged particle beams on the substrate.

7. The apparatus according to claim 6, wherein the controller is configured to obtain the dose at the position of each of the plurality of charged particle beams by dividing the target dose of each of the plurality of charged particle beams based on the target position and the position of each of the plurality of charged particle beams.

8. The apparatus according to claim 6, further comprising a detector configured to detect each of the plurality of charged particle beams,
wherein the controller is configured to obtain information on the position of each of the plurality of charged particle beams on the substrate based on an output from the detector.

9. The apparatus according to claim 6, further comprising a blanking device configured to perform blanking of each of the plurality of charged particle beams,
wherein the controller is configured to control the dose of each of the plurality of charged particle beams by controlling the blanking device.

10. The apparatus according to claim 6, wherein the controller is configured to control the dose of each of the plurality of charged particle beams by controlling number of charged particle beams with which the position of each of the plurality of charged particle beams are irradiated.

11. The apparatus according to claim 6, further comprising a projection system configured to project the plurality of charged particle beams on the substrate,
wherein the controller is configured to determine a projection magnification of the projection system, and obtain information on position of each of the plurality of charged particle beams projected on the substrate with the projection magnification.

12. A method of manufacturing an article, the method comprising steps of:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes
a controller configured to control a dose of the charge particle beam at each of a plurality of positions of the charged particle beam on the substrate based on information of displacement of each of the plurality of positions from a target position corresponding thereto and a target dose of the charged particle beam at the target position corresponding to each of the plurality of positions.

13. A method of manufacturing an article, the method comprising steps of:
performing drawing on a substrate using a drawing apparatus;
developing the substrate on which the drawing has been performed; and
processing the developed substrate to manufacture the article,
wherein the drawing apparatus performs drawing on the substrate with a plurality of charged particle beams, and includes
a controller configured to control a dose at a position of each of the plurality of charged particle beams on the substrate based on a target position of each of the plurality of charged particle beams on the substrate, a target dose at the target position of each of the plurality of charged particle beams, and a position of each of the plurality of charged particle beams on the substrate.

* * * * *